(12) United States Patent
Latrasse et al.

(10) Patent No.: US 11,120,972 B2
(45) Date of Patent: Sep. 14, 2021

(54) ELEMENTARY DEVICE FOR PRODUCING A PLASMA, HAVING A COAXIAL APPLICATOR

(71) Applicant: SAIREM SOCIETE POUR L'APPLICATION INDUSTRIELLE DE LA RECHERCHE EN ELECTRONIQUE ET MICRO ONDES, Miribel (FR)

(72) Inventors: Louis Latrasse, Dommartin (FR); Marilena Radoiu, Rillieux-la-Pape (FR)

(73) Assignee: SAIREM SOCIETE POUR L'APPLICATION INDUSTRIELLE DE LA RECHERCHE EN ELECTRONIQUE ET MICRO ONDES, Miribel (FR)

( * ) Notice: Subject to any disclaimer, the term of this patent is extended or adjusted under 35 U.S.C. 154(b) by 139 days.

(21) Appl. No.: 15/946,162

(22) Filed: Apr. 5, 2018

(65) Prior Publication Data
US 2018/0261433 A1    Sep. 13, 2018

Related U.S. Application Data

(63) Continuation of application No. PCT/FR2016/052546, filed on Oct. 4, 2016.

(30) Foreign Application Priority Data

Oct. 5, 2015  (FR) ...................................... 15/59459

(51) Int. Cl.
*H01J 37/32* (2006.01)
*H05H 1/46* (2006.01)

(52) U.S. Cl.
CPC .. *H01J 37/32229* (2013.01); *H01J 37/32192* (2013.01); *H01J 37/32211* (2013.01);
(Continued)

(58) Field of Classification Search
USPC ............................ 156/345.41; 118/723 MW
See application file for complete search history.

(56) References Cited

U.S. PATENT DOCUMENTS 5,527,391 A * 6/1996 Echizen .................. C23C 16/50
                                                         118/719
2002/0043342 A1* 4/2002 Taniguchi ......... H01J 37/32192
                                                         156/345.41

(Continued)

FOREIGN PATENT DOCUMENTS

FR        2955451        7/2011
JP      2000277295      10/2000
(Continued)

OTHER PUBLICATIONS

English Machine Translation WO2014/009412, Lacoste et al (Year: 2014).*

(Continued)

*Primary Examiner* — Rakesh K Dhingra
(74) *Attorney, Agent, or Firm* — Burris Law, PLLC

(57) ABSTRACT

The present disclosure relates to an elementary device for producing a plasma. The elementary device includes a coaxial applicator of microwave power that includes a conductive central core, a conductive external shield surrounding the central core, a medium located between the central core and the shield to propagate microwave energy, and an insulating body. The elementary device further includes a system to couple to a microwave generator and is disposed at the shield. The shield has a proximal end plugged with the insulating body made of dielectric material
(Continued)

that is transparent to the microwave energy. The insulating body has an external surface configured to contact and excite a gas located in the interior of a chamber. The insulating body extends exterior wise from the shield and its external surface is nonplanar and protrudes from the shield. The outside diameter of the body decreases from the shield to its tip.

10 Claims, 3 Drawing Sheets

(52) U.S. Cl.
CPC .. *H01J 37/32238* (2013.01); *H01J 37/32266* (2013.01); *H05H 1/46* (2013.01); *H01J 2237/0266* (2013.01); *H05H 1/4622* (2021.05)

(56) References Cited

U.S. PATENT DOCUMENTS

| | | | | |
|---|---|---|---|---|
| 2003/0168008 | A1* | 9/2003 | Ohmi | H01J 37/32192 |
| | | | | 118/715 |
| 2006/0086322 | A1* | 4/2006 | Lagarde | H01J 37/32192 |
| | | | | 118/723 MW |
| 2007/0264441 | A1* | 11/2007 | Ishibashi | H01J 37/32192 |
| | | | | 427/488 |
| 2008/0303744 | A1* | 12/2008 | Hirayama | B08B 7/00 |
| | | | | 343/900 |
| 2010/0183827 | A1* | 7/2010 | Hirayama | H05H 1/46 |
| | | | | 427/575 |
| 2012/0176723 | A1* | 7/2012 | Ikeda | F02P 9/007 |
| | | | | 361/253 |

FOREIGN PATENT DOCUMENTS

| | | | |
|---|---|---|---|
| JP | 2004-186303 | * | 7/2004 |
| JP | 2004186303 | | 7/2004 |
| JP | 2013098626 | | 5/2013 |
| WO | 2003/103003 | | 12/2003 |
| WO | 2014/009412 | | 1/2014 |

OTHER PUBLICATIONS

Machine Translation JP2004186303, Ishii et al (Year: 2004).*
International Search Report for International Application PCT/FR2016/052546, dated Dec. 8, 2016.

* cited by examiner (a)

PRIOR ART (b)

ELEMENTARY DEVICE FOR PRODUCING A PLASMA, HAVING A COAXIAL APPLICATOR

CROSS-REFERENCE TO RELATED APPLICATIONS

This application is a continuation of International Application No. PCT/FR2016/052546, filed on Oct. 4, 2016, which claims priority to and the benefit of FR 15/59459 filed on Oct. 5, 2015. The disclosures of the above applications are incorporated herein by reference.

FIELD

The present disclosure relates to an elementary device for producing a plasma, and to an installation for producing a plasma.

BACKGROUND

The statements in this section merely provide background information related to the present disclosure and may not constitute prior art.

It relates more specifically to an elementary device for producing a plasma comprising a microwave power coaxial applicator.

Installations for producing plasma inside a confinement chamber find applications in several fields, such as for example surface cleaning, sterilization, deposition, in particular plasma-enhanced chemical vapor deposition and diamond deposition, etching, and other surface treatments such as ion beam sputtering (or cathode sputtering).

In order to transmit microwave energy between a generator and the inside of the chamber, it is necessary to use at least one elementary device for producing a plasma, and generally a plurality of such elementary devices in association, which are often called elementary sources.

Referring to FIGS. 1(a) and 1(b), a conventional elementary device 10 includes a microwave power coaxial applicator 100 that allows transmitting the microwave energy from a waveguide or a coaxial cable to the chamber; such a coaxial applicator 100 including a conductive central core 101 extending along a main axis, a conductive outer shield 102 surrounding the central core 101, a medium 103 for propagating a microwave energy located between the central core 101 and the outer shield 102. The outer shield 102 has a peripheral wall, preferably cylindrical, closed at a distal end 104 by a bottom wall. The coaxial applicator 100 further comprises a coupling system 105 with the waveguide or the coaxial cable, this coupling system 105 being disposed on the peripheral wall of the outer shield 102, at a given distance relative to the bottom wall. The outer shield 102 is open at an opposite proximal end 106 provided to open into a plasma chamber (not illustrated), this open proximal end 106 being occluded by an insulating body 107 made of dielectric material transparent to microwave energy and having an outer surface 108 intended to be in contact with a gas to be energized localized inside the plasma chamber.

Indeed, the connection between the propagation medium 103 and the inside of the plasma chamber requires the use of an insulating dielectric body 107 (e.g., body made of quartz, alumina, boron nitride, etc) which allows, on the one hand, the transportation of the microwaves towards the chamber and, on the other hand, the sealing between the propagation medium 103 and the inside of the chamber, which is generally at a reduced pressure relative to the ambient atmospheric pressure.

In the two examples of FIGS. 1(a) and 1(b), the outer surface 108 of the insulating body 107 is planar, regardless of the configuration of the coaxial applicator 100 with the central core 101 which completely crosses the insulating body 107 and protrudes therefrom (FIG. 1(a)), or with the central core 101 which crosses the insulating body 107 and whose end is levelling with the outer surface 108 (FIG. 1(b)).

Thus, the outer surface 108 of the insulating body 107 is planar, and the Applicant has found that such a planar surface induces a very abrupt transition between the impedance of the insulating body 107 and the impedance of the plasma, which will naturally generate reflected power that must necessarily be compensated by an impedance adapter upstream of the coaxial applicator.

The document WO 2014/009412 discloses an elementary device for producing a plasma, comprising a microwave power coaxial applicator comprising a conductive central core extending along a main axis, a conductive outer shield surrounding the central core, a medium for propagating a microwave energy located between the central core and the shield, where the outer shield has a proximal end occluded by an insulating body made of dielectric material transparent to microwave energy, where this insulating body is in the form of a dielectric tube that has an outer surface intended to be in contact with a gas to be energized localized inside a chamber, and where the insulating body protrudes outwardly of the shield according to the main axis.

However, in this document WO 2014/009412, the outer surface of the dielectric tube is cylindrical, with a constant diameter up to its tip, and this insulating body protrudes from the shield over a large length (larger than its own outer diameter), because this dielectric tube is designed and shaped to fulfill a function of surface wave applicator, in other words so that the wave (or the microwave energy) propagates between the dielectric tube and the plasma, and that is why this dielectric tube protrudes outwardly of the shield over a length at least twice its outer diameter.

SUMMARY

In the context of the present disclosure, at least one objective is to improve the shape of the insulating body, not for increasing the propagation of microwave energy between its own surface and the plasma, but rather for promoting the penetration of the microwave energy in the plasma by limiting the reflected power.

The present disclosure aims at addressing the above-mentioned drawbacks and, it proposes an elementary device for producing a plasma. The elementary device comprising a microwave power coaxial applicator that comprises a conductive central core extending along a main axis, a conductive outer shield surrounding the central core, a medium for propagating a microwave energy located between the central core and the outer shield, and a system for coupling with a microwave energy generator. The outer shield has a proximal end occluded by an insulating body made of dielectric material transparent to microwave energy and having an outer surface intended to be in contact with a gas to be energized localized inside a plasma chamber. The outer surface having a symmetry of revolution about the main axis, where the insulating body protrudes outwardly of the shield according to the main axis. The device being improved in that the outer surface is non-planar and projects outside of the shield and having a decreasing outer diameter along the main axis starting from the shield up to its tip.

Thus, when in place, the insulating body penetrates inside the plasma chamber, and its non-planar outer surface allows creating a plasma volume controlled by the very shape of this outer surface, and thereby ensuring a non-abrupt transition between the impedance of the insulating body and the impedance of the plasma, which allows reducing the reflected power.

Furthermore, the insulating body narrows as it gets away from the shield, in other words as it penetrates inside the gas to be energized, to improve the transition between the impedance of the insulating body and the impedance of the plasma.

In one form, the outer diameter of the outer surface decreases continuously along the main axis starting from the shield up to its tip.

Thus, the outer surface does not exhibit any discontinuous variation of its diameter, in other words it has no stage, stairs or notch, but the insulating body rather has a continuous outer surface up to its tip, for optimizing energy transfer.

In another form, the outer surface of the insulating body has a generally truncated-cone shape. In this form, two possibilities may be considered: the outer surface of the insulating body has a generally truncated-cone shape truncated at its end and having a flat or rounded tip; or the outer surface of the insulating body has a generally truncated-cone shape not truncated at its end and having a sharp tip.

In yet another form, the outer surface of the insulating body has a generally hemispherical shape.

According to one form, the outer surface of the insulating body has no right-angled edges.

According to another form, the central core has a proximal end embedded inside the insulating body, without completely passing through the insulating body.

In one form, the proximal end of the central core protrudes from the shield according to the main axis. Thus, the central core is longer than the shield.

According to another form, the insulating body and the shield revolve about a common main axis, and the maximum outer diameter of the insulating body is substantially equivalent to or larger than the outer diameter of the shield.

In yet another form, the insulating body has an inner surface in contact with the propagation medium and crossed by the central core, the inner surface being non-planar and non-orthogonal to the main axis.

According to one form of the present disclosure, the inner surface has an increasing outer diameter along the main axis in a direction of displacement starting from a distal end of the coaxial applicator towards a proximal end occluded by the insulating body.

According to another form of the present disclosure, the inner surface of the insulating body has a generally truncated-cone shape.

In yet another form, the body protrudes outwardly of the shield according to the main axis by a distance smaller than or equal to the inner diameter of the shield at its proximal end.

Thus, the insulating body projects over a limited distance, smaller than or equal to its own outer diameter at the proximal end of the shield, for optimizing the penetration of the microwave energy, in other words for reducing the losses and the reflections during the transfer.

The present disclosure concerns an installation for producing a plasma comprising: a chamber within which the plasma is produced and confined, the chamber being delimited by a partition; at least one microwave energy generator; and at least one elementary device in accordance with the present disclosure, whose coupling system is coupled with the microwave energy generator and whose outer surface of the insulating body penetrates inside the chamber beyond its partition.

According to one form of the present disclosure, the shield of the coaxial applicator is constituted by a part attached onto the chamber and crossing its partition in a sealed manner.

According to another form of the present disclosure, the shield of the coaxial applicator is integrally formed at least partially with the partition.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIGS. 1(a) and 1(b) are axial sectional views of two conventional elementary devices for producing a plasma;

Figure 1:
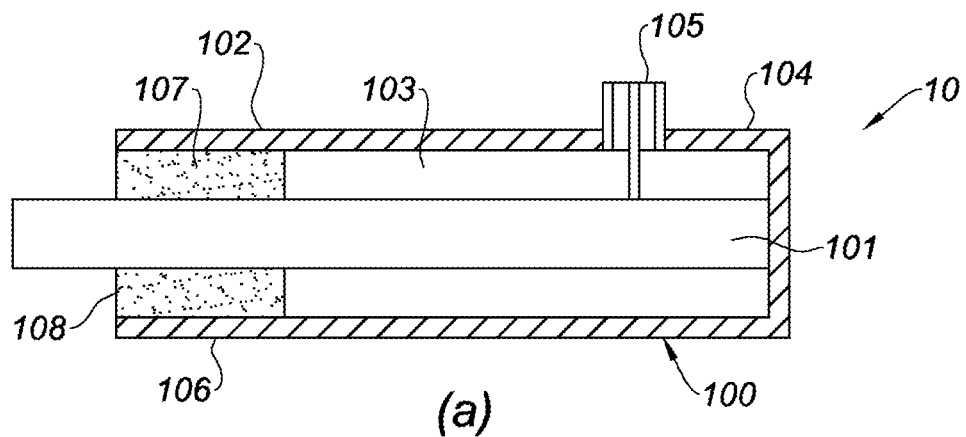
Figure 1:
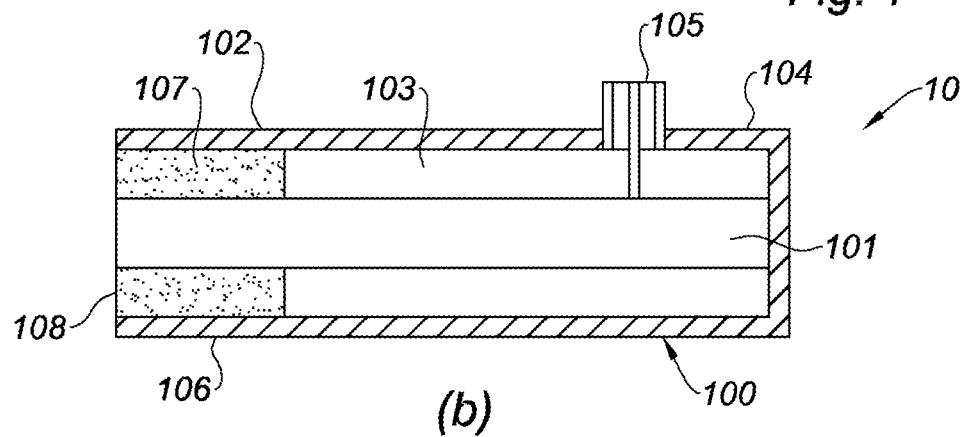

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 2:
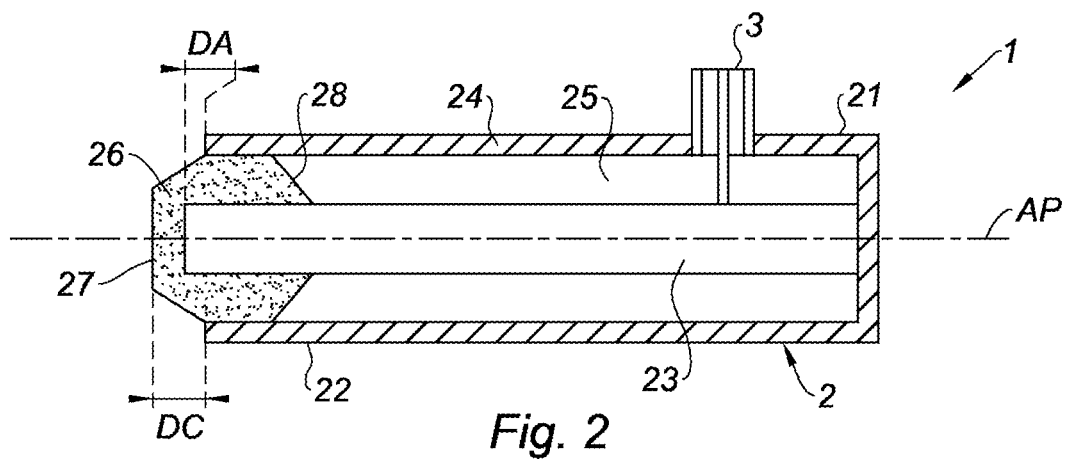
FIG. 2 is a schematic axial sectional view of a first elementary device in accordance with the present disclosure.
Figure 3:
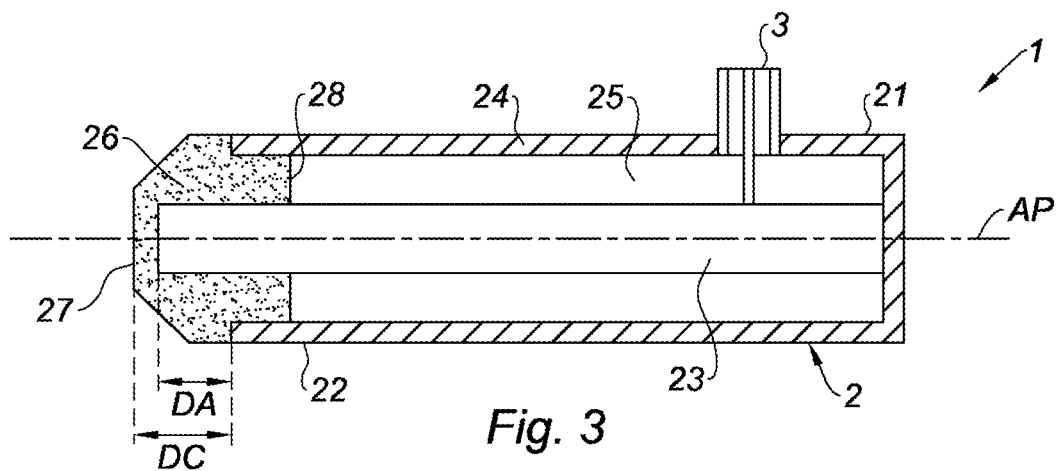
FIG. 3 is a schematic axial sectional view of a second elementary device in accordance with the present disclosure.
Figure 4:
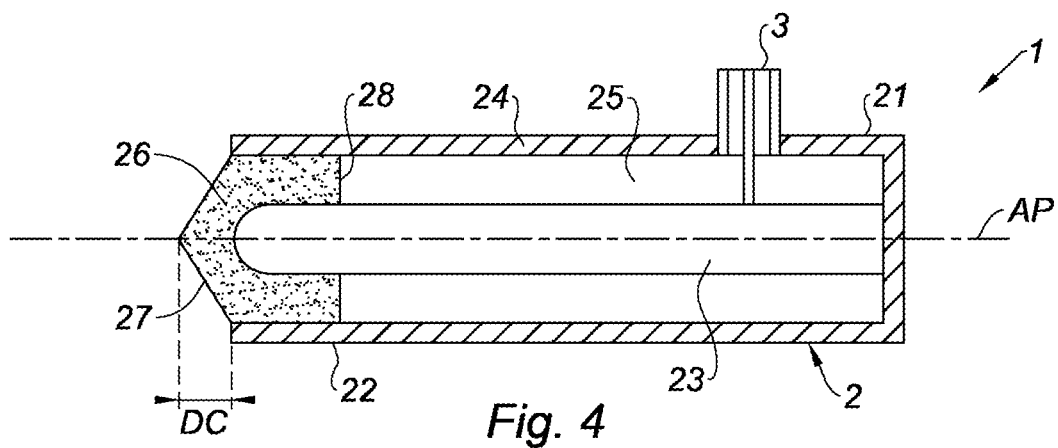
FIG. 4 is a schematic axial sectional view of a third elementary device in accordance with the present disclosure.
Figure 5:
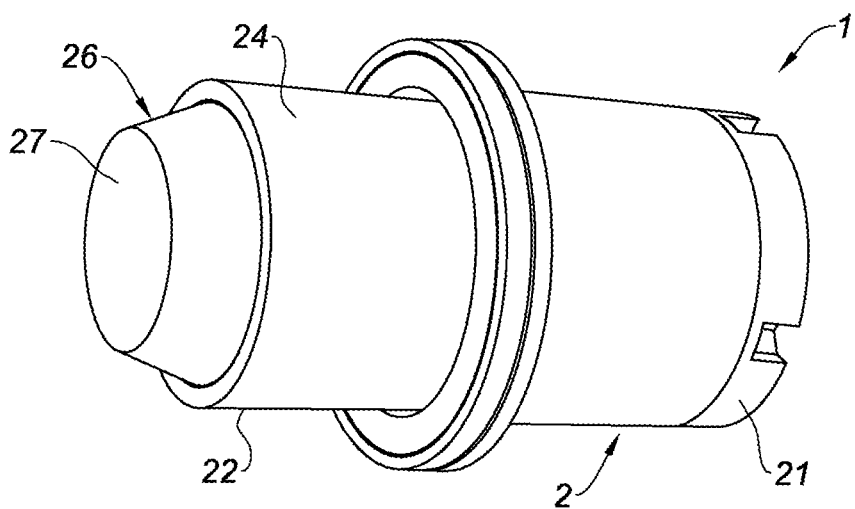
FIG. 5 is a schematic perspective view of the first elementary device of FIG. 2.

FIGS. 2 to 5 illustrate three forms of an elementary device 1 for producing a plasma, with a first form illustrated in FIGS. 2 and 5, a second form illustrated in FIG. 3 and a third form illustrated in FIG. 4, and unless otherwise explicitly or implicitly stated, members, parts, devices or elements that are structurally or functionally identical or similar will be designated by identical references in these figures.

Figure 6:
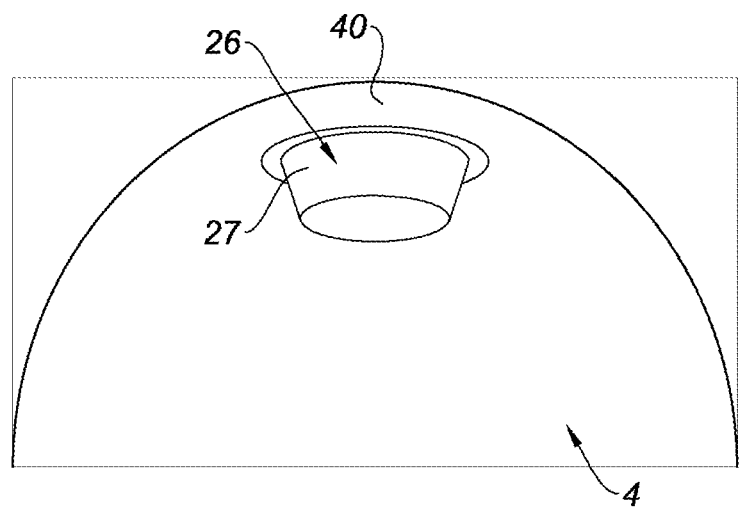
FIG. 6 is a schematic view of the inside of a plasma chamber in which the first elementary device of FIGS. 2 and 5 is placed.
Figure 7:
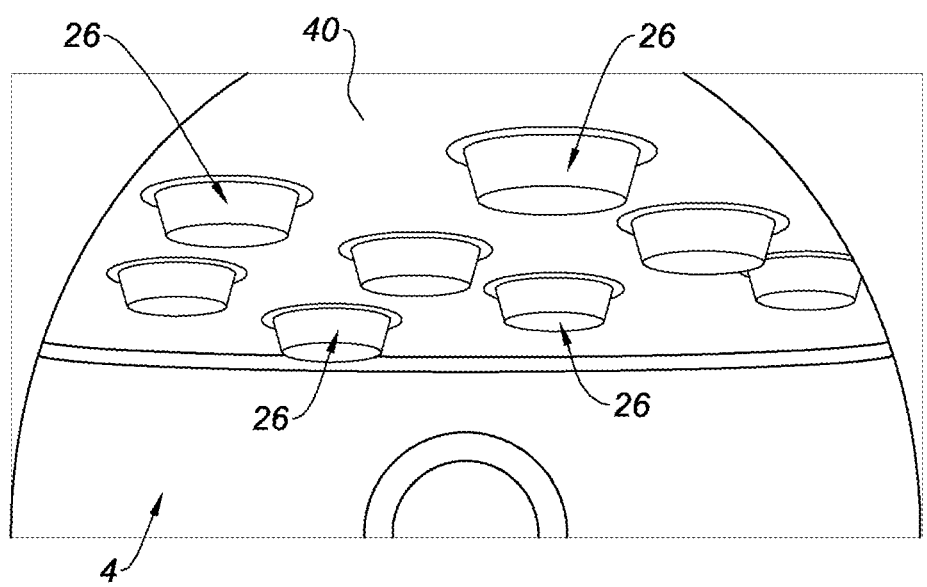
FIG. 7 is a schematic view of the inside of a plasma chamber in which several first elementary devices of FIGS. 2 and 5 are placed.

The elementary device 1 comprises a microwave power coaxial applicator 2, provided to ensure the transmission of a microwave energy between a microwave energy generator (not illustrated), in particular of the solid-state generator type, and the inside of a plasma chamber 4 (shown in FIGS. 6 and 7).

This coaxial applicator 2 is made in a filiform shape, that is to say an elongated along a main axis AP, and it has: a distal end 21; and an opposite proximal end 22 intended to open into the chamber 4.

The coaxial applicator 2 comprises:

a conductive central core 23 extending along the main axis AP, and being in the form of a rod, and in particular a rod with a constant cross-section;

a conductive outer shield 24 surrounding the central core 23, this outer shield 24 being in the form of a hollow sleeve comprising a peripheral wall having a cylindrical inner face centered on the main axis AP, and a bottom wall closing the distal end 21 of the coaxial applicator 2;

a medium 25 for propagating the microwave energy located between the central core 23 and the shield 24, this propagation medium 25 being for example composed of air; and an insulating body 26 made of dielectric material transparent to microwave energy, this insulating body 26 being disposed on the proximal end 22 of the coaxial applicator 2.

At the proximal end 22, the shield 24 has an open proximal end occluded by the insulating body 26 which guarantees the sealing between the propagation medium 25 and the inside of the chamber 4.

The coaxial applicator 2 further comprises a coupling system 3 for coupling to the microwave energy generator. This coupling system 3 is constituted by any appropriate means ensuring the connection with a coaxial cable or a waveguide (not illustrated) connecting the generator to the coupling system 3.

In the example of FIGS. 2 to 4, the coupling system 3 is designed for coupling with a coaxial cable and, for this purpose, has a structure of the coaxial structure type; such a coaxial structure comprising an outer conductor in contact with the shield 24 (described below) of the coaxial applicator 2 and surrounding an inner conductor that comes into contact with the central core 23 (described below) of the coaxial applicator 2.

This coupling system 3 may be positioned on the bottom wall of the shield 24, or on its peripheral wall.

The insulating body 26 occludes completely the proximal end 22 of the coaxial applicator 2, thereby separating the inside of the chamber 4, which is often maintained at low pressure, from the propagation medium 25, which is at ambient atmospheric pressure.

The insulating body 26 is a part of revolution about the main axis AP, and has an outer surface 27 intended to be in contact with the inside of the chamber 4, and more precisely with a gas to be energized localized inside the chamber 4.

Furthermore, this insulating body 26 protrudes outwardly of the shield 24 according to the main axis AP by a distance DC, and its outer surface 27 is non-planar and projects outside of the shield 24 by this distance DC.

This distance DC is smaller than or equal to the inner diameter of the shield 24 at its proximal end; the inner diameter of the proximal end of the shield 24 meaning the diameter of its peripheral or cylindrical inner face that is in contact with the insulating body 26. Thus, this distance DC is smaller than or equal to the outer diameter of the insulating body 26 considered at the proximal end of the shield 24.

This outer surface 27 is thus curved outwardly of the shield 24, without a right-angled edge, and it has a symmetry of revolution about the main axis AP.

In general, the diameter of this outer surface 27 decreases continuously (that is to say without any step, notch or stage) along the main axis AP starting from the shield 24 up to its tip.

This outer surface 27 has for example a generally truncated-cone shape truncated at its end and having a flat tip (as shown in FIGS. 2, 3 and 5), or a generally truncated-cone shape not truncated at its end and presenting a sharp tip (as shown in FIG. 4).

It should be noted that the outer surface 27 has a generally right (with a rectilinear generatrix, as illustrated in FIGS. 2 to 7), or concave or convex (with a curved generatrix) truncated-cone shape.

In non-illustrated variants, the outer surface 27 has a generally truncated-cone shape truncated at its end and having a rounded tip, or has a generally hemispherical shape.

In general, the outer surface 27 has a decreasing outer diameter along the main axis AP starting from the shield 24 up to its tip (or to its free end). Thus, as it gets away from the shield 24 (and thus by plunging inside the chamber 4), the outer diameter of the outer surface 27 decreases, for example regularly (truncated-cone surface) or irregularly.

In addition, the insulating body 26 also has an inner surface 28 in contact with the propagation medium 25, completely surrounded by the shield 24 and crossed by the central core 23; this inner surface 28 being the transverse surface which is in contact with the propagation medium 25.

This inner surface 28 may be planar and perpendicular to the main axis AP, as shown in the forms of FIGS. 3 and 4.

As shown in the form of FIG. 2, this inner surface 28 may be non-planar. This inner surface 28 is non-planar for the same reasons as those mentioned for the outer surface 27, that is to say for promoting the penetration of the waves of the propagation medium 25 to the gas to be energized through the insulating body 26, and avoiding abrupt impedance interruptions and avoiding useless generation of reflected power.

In general, the inner surface 28 is not orthogonal to the main axis AP and has an increasing outer diameter along the main axis AP in a direction of displacement starting from the distal end 21 towards the proximal end 22 occluded by the insulating body 26.

This inner surface 28 has for example a generally truncated-cone shape, and more precisely a generally right (with a rectilinear generatrix, as illustrated in FIG. 2), or concave or convex (with a curved generatrix) truncated-cone shape.

In the forms illustrated in FIGS. 2 to 4, the central core 23 has a proximal end embedded inside the insulating body 26, without passing completely through this insulating body 26.

In the examples of FIGS. 2 and 3, the proximal end of the central core 23 protrudes from the shield 24 according to the main axis AP by a distance DA smaller than the distance DC.

In the example of FIG. 4, the proximal end of the central core 23 is located in alignment with the proximal end of the shield 24, and therefore does not protrude from the shield 24.

In the examples of FIGS. 2 and 4, the maximum outer diameter of the insulating body 26 is substantially equivalent to the inner diameter of the shield 24. In the example of FIG. 3, the maximum outer diameter of the insulating body 26 is substantially equivalent to the outer diameter of the shield 24, so that the insulating body 26 has a shoulder extended by a section of a reduced diameter substantially equivalent to the inner diameter of the shield 24, this section being pushed into the shield 24.

In non-illustrated variants, the proximal end of the central core 23 is set back (on the inside of the shield 24) with respect to the proximal end of the shield 24.

In non-illustrated variants, the maximum outer diameter of the insulating body 26 is larger than the outer diameter of the shield 24. In the case where the maximum outer diameter of the insulating body 26 is equivalent to or larger than the outer diameter of the shield 24, it is also conceivable that the insulating body 26 is partly in contact with the partition 40 of the chamber 4.

Such an elementary device 1 is used in an installation for producing a plasma comprising:

the chamber 4 within which the plasma is produced and confined, this chamber being delimited by a partition 40;

at least one microwave energy generator (not illustrated), in particular of the solid-state generator type;

at least one coaxial cable or waveguide (not illustrated) connected on the one hand to the generator and on the other hand to the coupling system 3 of an elementary device 1; and at least one elementary device 1 whose outer surface 27 of the insulating body 26 penetrates inside the chamber beyond its partition 40, as shown in FIGS. 6 and 7.

It should be noted that the shield 24 of the coaxial applicator 2 is either: constituted by a part attached onto the chamber 4 and crossing its partition 40 in a sealed manner; or is integrally formed at least partially with the partition 40. In other words, the shield 24 is formed partially or totally by the partition 40 itself.

The description of the disclosure is merely exemplary in nature and, thus, variations that do not depart from the substance of the disclosure are intended to be within the scope of the disclosure. Such variations are not to be regarded as a departure from the spirit and scope of the disclosure.

The invention claimed is:

1. An elementary device for an installation for producing a plasma, the elementary device comprising:
    a coaxial applicator of microwave power, the coaxial applicator comprises:
    a conductive central core extending along a main axis; a conductive outer shield surrounding the conductive central core;
    a medium located between the conductive central core and the conductive outer shield to propagate a microwave energy, wherein the medium is air; and
    an insulating body made of dielectric material transparent to the microwave energy and having an outer surface that is configured to be in contact with a gas to be energized localized inside a chamber in which the plasma is produced; and
    a coupling system configured to couple to a microwave energy generator, wherein the coupling system includes an outer conductor in contact with the conductive outer shield, wherein:
    the coupling system is disposed at the conductive outer shield,
    the conductive outer shield has a proximal end occluded by the insulating body and has a symmetry of revolution about the main axis,
    the insulating body protrudes outwardly of the conductive outer shield according to the main axis, the outer surface is non-planar and projects outside of the conductive outer shield with a decreasing outer diameter along the main axis starting from the conductive outer shield up to its tip,
    the insulating body has an inner surface in contact with the medium and crossed by the conductive central core, the inner surface being non-planar and non-orthogonal to the main axis,
    the conductive central core has a proximal end embedded inside the insulating body, without passing completely through the insulating body,
    all of the outer surface including an end face of the proximal end of the conductive central core is directly in contact with the insulating body, and
    the insulating body protrudes outwardly of the conductive outer shield according to the main axis by a distance which is smaller than or equal to an inner diameter of the conductive outer shield at its proximal end.

2. The elementary device according to claim 1, wherein the outer diameter of the outer surface decreases continuously along the main axis starting from the conductive outer shield up to its tip.

3. The elementary device according to claim 2, wherein the outer surface of the insulating body has a substantially truncated-cone or hemispherical shape.

4. The elementary device according to claim 3, wherein the outer surface of the insulating body has one of a substantially truncated-cone shape truncated at its end with a flat or rounded tip, or a substantially truncated-cone shape not truncated at its end with a sharp tip.

5. The elementary device according to claim 1, wherein the outer surface of the insulating body has no right-angled edges.

6. The elementary device according to claim 1, wherein the proximal end of the conductive central core protrudes from the conductive outer shield according to the main axis.

7. The elementary device according to claim 1, wherein the inner surface has an increasing outer diameter along the main axis in a direction of displacement from a distal end of the coaxial applicator towards a proximal end occluded by the insulating body.

8. The elementary device according to claim 1, wherein the inner surface of the insulating body has a generally truncated-cone shape.

9. An installation for producing a plasma comprising:
    a chamber within which the plasma is produced and confined, the chamber being delimited by a partition;
    at least one microwave energy generator; and
    at least one elementary device in accordance with claim 1, wherein the coupling system of the at least one elementary device is coupled with the microwave energy generator and the outer surface of the insulating body penetrates inside the chamber beyond its partition.

10. The installation according to claim 9, wherein the conductive outer shield of the coaxial applicator is either constituted by a part attached to the chamber and crossing its partition in a sealed manner, or is integrally formed at least partially with the partition.

* * * * *